United States Patent
Butler et al.

(10) Patent No.: US 9,715,171 B2
(45) Date of Patent: Jul. 25, 2017

(54) IMPRINT LITHOGRAPHIC APPARATUS AND IMPRINT LITHOGRAPHIC METHOD

(75) Inventors: Hans Butler, Best (NL); Johannes Petrus Martinus Bernardus Vermeulen, Helmond (NL); Marc Wilhelmus Maria Van Der Wijst, Veldhoven (NL); Jeroen Pieter Starreveld, Eindhoven (NL); Cornelius Adrianus Lambertus De Hoon, Best (NL); Francois Xavier Debiesme, Weert (NL)

(73) Assignee: ASML NETHERLANDS B.V., Veldhoven (NL)

( * ) Notice: Subject to any disclaimer, the term of this patent is extended or adjusted under 35 U.S.C. 154(b) by 272 days.

(21) Appl. No.: 12/964,459

(22) Filed: Dec. 9, 2010

(65) Prior Publication Data

US 2011/0163477 A1 Jul. 7, 2011

Related U.S. Application Data (60) Provisional application No. 61/289,844, filed on Dec. 23, 2009.

(51) Int. Cl.
*B29C 59/02* (2006.01)
*G03F 7/00* (2006.01)
(Continued)

(52) U.S. Cl.
CPC ............ *G03F 7/0002* (2013.01); *B82Y 10/00* (2013.01); *B82Y 40/00* (2013.01); *F16F 9/535* (2013.01);
(Continued)

(58) Field of Classification Search
CPC ....... G03F 7/0002; B82Y 10/00; B82Y 40/00; B29C 2059/023; B29C 2043/025;
(Continued)

(56) References Cited

U.S. PATENT DOCUMENTS

| 4,731,255 A | 3/1988 | Maeda et al. |
| 5,772,905 A | 6/1998 | Chou |

(Continued)

FOREIGN PATENT DOCUMENTS

| JP | 60-180840 | 9/1985 |
| JP | 60-241539 | 11/1985 |

(Continued)

OTHER PUBLICATIONS

J. Haisma, "Mold-assisted nanolithography: A process for reliable pattern replication", J. Vac. Sci. Technol. B14(6), Nov./Dec. 1996.

(Continued)

*Primary Examiner* — Yogendra Gupta
*Assistant Examiner* — Ninh Le
(74) *Attorney, Agent, or Firm* — Pillsbury Winthrop Shaw Pittman LLP (57) ABSTRACT

An imprint lithography apparatus includes an actuator configured to displace an imprint template holder relative to a substrate holder to perform an imprint process. The imprint template holder and/or the substrate holder being supported on a support structure, the support structure being mounted to a vibration isolation system that is mounted to a base of the apparatus. The vibration isolation system is configured to provide a vibration isolation of the support structure relative to the base. A control unit is configured to control the actuator during the imprint process. The control unit is arranged to control an adjustable member of the vibration isolation system to adjust a dynamical characteristic of the vibration isolation system during at least part of the imprint process so as to reduce a displacement of the support structure relative to the base due to a force exerted on the support structure during the imprint process.

11 Claims, 6 Drawing Sheets

(51) Int. Cl.
*F16F 15/03* (2006.01)
*F16F 9/53* (2006.01)
*F16F 15/00* (2006.01)
*F16F 15/027* (2006.01)
*B82Y 10/00* (2011.01)
*B82Y 40/00* (2011.01)
*B29C 43/02* (2006.01)

(52) U.S. Cl.
CPC ........ *F16F 15/002* (2013.01); *F16F 15/0275* (2013.01); *F16F 15/03* (2013.01); *B29C 2043/025* (2013.01)

(58) Field of Classification Search
CPC .... F16F 7/00; F16F 7/10; F16F 7/1005; F16F 7/1011; F16F 7/1017; F16F 9/50; F16F 9/53; F16F 9/535; F16F 15/005; F16F 15/002; F16F 15/02; F16F 15/023; F16F 15/027; F16F 15/0275; F16F 15/03
USPC .......................................... 264/293; 425/385
See application file for complete search history.

(56) References Cited

U.S. PATENT DOCUMENTS

| | | | |
|---|---|---|---|
| 6,334,960 | B1 | 1/2002 | Willson et al. |
| 7,381,272 | B2 * | 6/2008 | Kasumi et al. ............... 118/500 |
| 7,445,094 | B1 * | 11/2008 | Henderson et al. .......... 188/267 |
| 2004/0134566 | A1 | 7/2004 | Iyoda et al. |
| 2005/0274693 | A1 | 12/2005 | Heidari et al. |
| 2006/0060791 | A1 * | 3/2006 | Hazelton .................. 250/441.11 |
| 2006/0126040 | A1 * | 6/2006 | Butler et al. ..................... 355/53 |
| 2006/0196415 | A1 * | 9/2006 | Lee et al. ...................... 118/102 |
| 2008/0013097 | A1 * | 1/2008 | E. del Puerto ................ 356/500 |

FOREIGN PATENT DOCUMENTS

| | | |
|---|---|---|
| JP | 03-043185 | 2/1991 |
| JP | 2001023896 A * | 1/2001 |
| JP | 2003-148552 | 5/2003 |
| JP | 2003-232398 | 8/2003 |
| JP | 2005-167166 | 6/2005 |
| JP | 2007-329367 | 12/2007 |
| JP | 2009-507359 | 2/2009 |
| WO | 02/067055 A2 | 8/2002 |
| WO | WO 2008099795 A2 * | 8/2008 ............... G03F 7/00 |

OTHER PUBLICATIONS

Japanese Office Action dated Jun. 19, 2012 in corresponding Japanese Patent Application No. 2010-282942.

* cited by examiner

IMPRINT LITHOGRAPHIC APPARATUS AND IMPRINT LITHOGRAPHIC METHOD

CROSS REFERENCE TO RELATED APPLICATIONS

This application claims priority and benefit under 35 U.S.C. §119(e) to U.S. Provisional Patent Application No. 61/289,844, entitled "Imprint Lithographic Apparatus and Imprint Lithographic Method", filed on Dec. 23, 2009. The content of that application is incorporated herein in its entirety by reference.

FIELD

The present invention relates to imprint lithography, in particular to a vibration isolation system as can be applied in an imprint lithographic apparatus.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are however rather costly.

A potentially less costly approach to smaller features that has gained increasing interest is so-called imprint lithography, which generally involves the use of a "stamp" (often referred to as an imprint template) to transfer a pattern onto a substrate. A potential advantage of imprint lithography is that the resolution of the features is not limited by, for example, the emission wavelength of a radiation source or the numerical aperture of a projection system. Instead, the resolution is mainly limited to the pattern density on the imprint template.

Imprint lithography involves the patterning of an imprintable medium on a surface of a substrate to be patterned. The patterning may involve pressing together a patterned surface of an imprint template and a layer of imprintable medium such that the imprintable medium flows into recesses in the patterned surface and is pushed aside by protrusions on the patterned surface. The recesses define pattern features of the patterned surface of the imprint template. Typically, the imprintable medium is flowable as the patterned surface and the imprintable medium are pressed together. Following patterning of the imprintable medium, the imprintable medium is suitably brought into a non-flowable or solid state and the patterned surface of the imprint template and the patterned imprintable medium are separated. The substrate and patterned imprintable medium are then typically processed further in order to pattern or further pattern the substrate. The imprintable medium is typically formed from resist droplets on the surface of a substrate to be patterned.

Compared to conventional lithography, imprint lithography faces the same challenges with respect to accuracy and throughput or yield. As such, it is desirable to have an accurate alignment of an imprint template and a substrate (comparable to the alignment requirements of a mask or reticle and a wafer in conventional lithography) before the imprint template is pressed into the imprintable medium. In order to obtain such accurate alignment, an accurate positioning, substantially free of external disturbances, of the imprint template and the substrate is desired. In order to realize this, both the imprint template and the substrate can be mounted on a vibration isolation system thus creating an isolated environment, substantially free of vibrations such as floor vibrations. Such a vibration isolation system is often characterized by a comparatively low stiffness and damping resulting in a cut-off frequency of e.g. 1 Hz or less.

Similar to conventional lithography, an imprint lithographic apparatus should, for economic reasons, be capable of processing a sufficient number of wafers or substrates per unit of time without compromising the accuracy or yield. In order to achieve such a sufficient throughput (e.g. expressed as the number of wafers processed per hour), the time expiring between two consecutive imprint steps should be kept as brief as possible.

If a vibration isolation system is used in a conventional lithographic apparatus were to be implemented in an imprint lithographic apparatus, it would be difficult to realize a sufficient throughput. This is due to the particular nature of the imprint process, which uses relatively high forces exerted on the substrate and imprint template.

In view of this, it is desirable to provide a vibration isolation system for an imprint lithographic apparatus which enables improvement of the apparatus's throughput, substantially without adversely affecting the accuracy of the imprint process.

SUMMARY

According to an aspect of the invention, there is provided an imprint lithography apparatus that includes an imprint template holder configured to hold an imprint template, a substrate holder configured to hold a substrate, and an actuator configured to displace the imprint template holder relative to the substrate holder to perform an imprint process. The imprint template holder and/or the substrate holder being supported on a support structure. The support structure is mounted to a vibration isolation system that is mounted to a base of the apparatus. The vibration isolation system is configured to provide a vibration isolation of the support structure relative to the base. A control unit is configured to control the actuator during the imprint process. The control unit is arranged to control an adjustable member of the vibration isolation system to adjust a dynamical characteristic of the vibration isolation system during at least part of the imprint process so as to reduce a displacement of the support structure relative to the base due to a force exerted on the support structure during the imprint process.

According to an aspect of the invention, there is provided an imprint lithographic method that includes providing an imprint template and a substrate, providing an imprintable medium on the substrate, supporting an imprint template holder holding the imprint template and/or a substrate holder holding the substrate on a support structure, and providing a vibration isolation of the support structure relative to a base by a vibration isolation system. The method includes aligning the substrate and the imprint template by an actuator, displacing the imprint template holder relative to the substrate holder to perform an imprint process, and controlling an adjustable member of the vibration isolation system to adjust a dynamical characteristic of the vibration isolation system during at least part of the imprint process so as to reduce a displacement of the support structure relative to the base due to a force exerted on the support structure during the imprint process.

BRIEF DESCRIPTION OF THE DRAWINGS

Specific embodiments of the invention will be described with reference to the accompanying figures, in which.

DETAILED DESCRIPTION

Figure 1A:
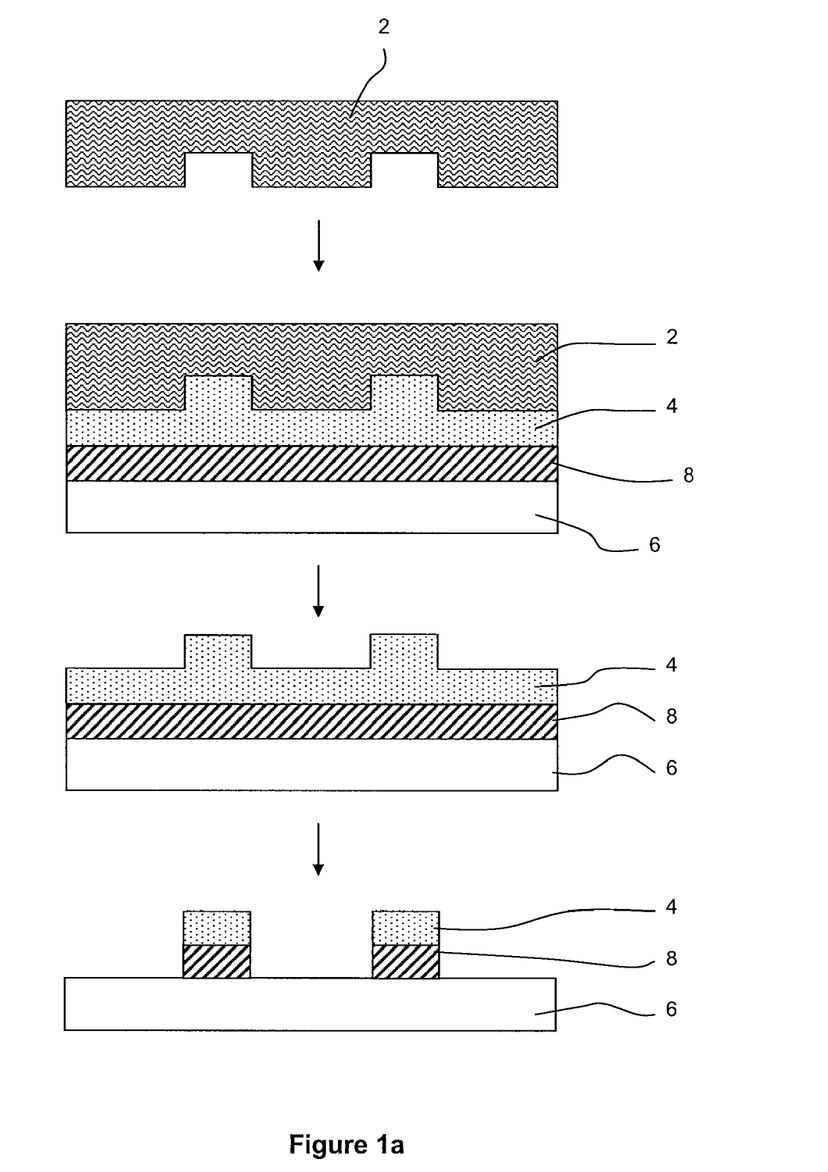
FIGS. 1a and 1b schematically depict examples of, respectively, hot imprint, and UV imprint lithography.
Figure 1B:
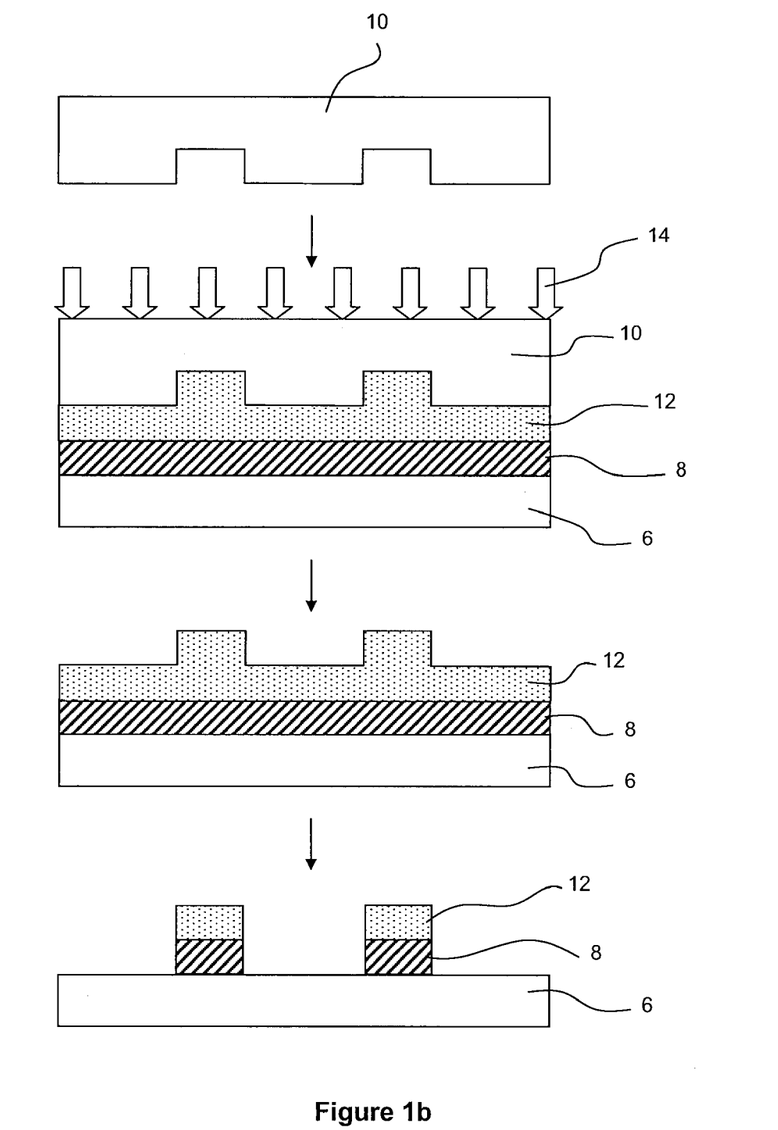

Examples of approaches to imprint lithography are schematically depicted in FIGS. 1a to 1b.

FIG. 1a shows an example of so-called hot imprint lithography (or hot embossing). In a typical hot imprint process, a template 2 is imprinted into a thermosetting or a thermoplastic imprintable medium 4, which has been cast on the surface of a substrate 6. The imprintable medium 4 may for example be resin. The resin may for instance be spin coated and baked onto the substrate surface or, as in the example illustrated, onto a planarization and transfer layer 8 of the substrate 6. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template 2 may then be removed and the patterned resin cooled. In hot imprint lithography employing a layer of thermoplastic polymer resin, the thermoplastic resin is heated so that it is in a freely flowable state immediately prior to imprinting with the template 2. It may be necessary to heat thermoplastic resins to temperatures considerably above the glass transition temperature of the resin. The template is pressed into the flowable resin and then cooled to below its glass transition temperature with the template 2 in place to harden the pattern. Thereafter, the template 2 is removed. The pattern will consist of the features in relief from a residual layer of the resin which may then be removed by an appropriate etch process to leave only the pattern features. Examples of thermoplastic polymer resins used in hot imprint lithography processes are poly (methyl methacrylate), polystyrene, poly (benzyl methacrylate) or poly (cyclohexyl methacrylate). For more information on hot imprint lithography, see e.g. U.S. Pat. No. 4,731,255 and U.S. Pat. No. 5,772,905.

FIG. 1b shows an example of UV imprint lithography, which involves the use of a transparent or translucent template which is transmissive to UV and a UV-curable liquid as imprintable medium (the term "UV" is used here for convenience but should be interpreted as including any suitable actinic radiation for curing the imprintable medium). UV curable liquids are often less viscous than the thermosetting and thermoplastic resins used in hot imprint lithography and consequently may move much faster to fill template pattern features. A quartz template 10 is applied to a UV-curable resin 12 in a similar manner to the process of FIG. 1a. However, instead of using heat or temperature cycling as in hot imprint, the pattern is solidified by curing the imprintable medium 12 with UV radiation 14 that is applied through the quartz template 10 onto the imprintable medium 12. After removal of the template 10, the imprintable medium 12 is etched. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint lithography, see e.g. U.S. Published Application No. 2004-0134566, U.S. Pat. No. 6,334,960, PCT Publication No. WO 02/067055, and the article by J. Haisma entitled "Mold-assisted nanolithography: A process for reliable pattern replication", J. Vac. Sci. Technol. B24(6), November/December 1996.

Combinations of the above imprint techniques are also possible. See, e.g., U.S. Published Application No. 2005-0274693, which mentions a combination of heating and UV curing an imprintable medium.

Figure 2:
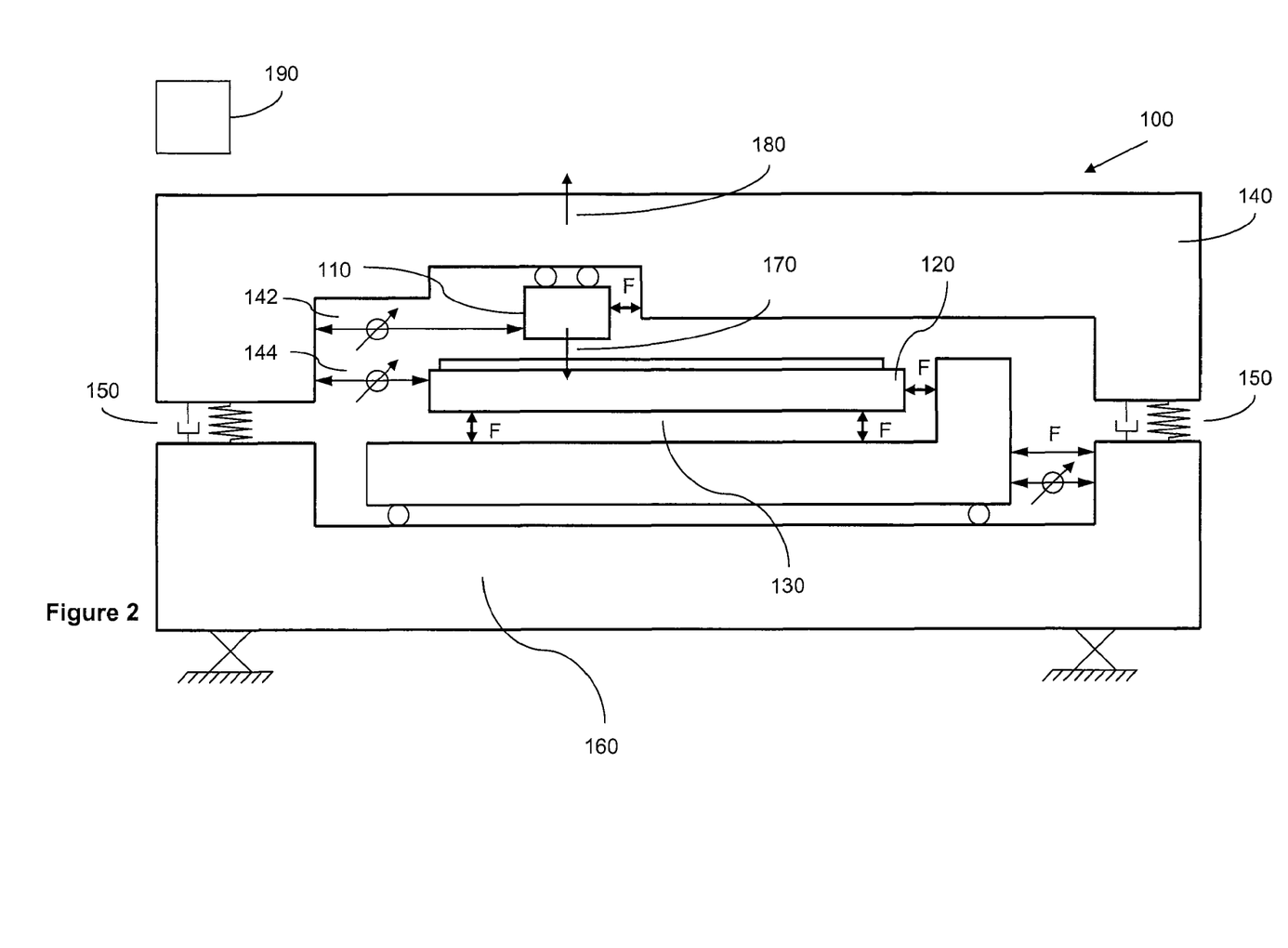
FIG. 2 schematically depicts an embodiment of a vibration isolation system as can be applied in an imprint lithographic apparatus according to an embodiment of the invention.

FIG. 2 schematically depicts an embodiment of an imprint lithography apparatus 100 according to the invention.

In the imprint lithography apparatus 100 according to an embodiment of the invention, an imprint template holder 110 and a substrate holder 120 are provided. Such an imprint template holder may, in use, hold a single imprint template (or stamp) or a plurality of imprint templates. Alternatively, the apparatus can be provided with a plurality of template holders, each arranged to hold a single imprint template. Similarly, the substrate holder, e.g. a substrate table, can be arranged to accommodate a single substrate or a plurality of substrates.

The apparatus 100 further comprises an actuator mechanism, or actuator, 130 that enables an imprint process to be performed. In general, the actuator mechanism can comprise a plurality of actuators (e.g. electromagnetic or piezo-electric actuators) or motors for displacing the imprint template holder and/or the substrate table during the imprint process. In FIG. 2, the actuator mechanism 130 is arranged to displace the substrate holder whereas in FIG. 3, the actuator mechanism is arranged to displace the imprint template holder. As will be understood by the skilled person, an arrangement whereby the actuator mechanism 130 of the apparatus is arranged to both displace the substrate holder and the imprint template holder is equally feasible. The actuator mechanism 130 according to the invention is controlled by a control unit 190 of the apparatus. Such a control unit (e.g. implemented as a microprocessor or microcomputer) can for example receive an input signal representing a relative position of the imprint template with respect to the substrate and a set-point for said relative position and determine, based on said signal and set-point, an appropriate control signal for the actuator mechanism. The imprint process as performed by the imprint lithographic apparatus according to an embodiment of the invention can be carried out as follow:

First, an appropriate alignment of the imprint template and the substrate is completed in order to ensure that the pattern provided on the imprint template is applied at the appropriate position on the substrate. The actuator mechanism as mentioned can provide the desired displacements of the imprint template holder and the substrate holder to obtain this alignment. In the apparatus according to an embodiment of the invention, the imprint template holder and/or the substrate holder are mounted to a support structure 140 that is substantially isolated from vibrations from the environment. In the embodiment as shown, the imprint template holder 110 is mounted to the support structure 140. Such a support structure that supports the imprint template holder and/or the substrate holder can further be equipped with a measurement system (not shown) for determining a relative position of the imprint template and the substrate. Such a system can for example comprise one or more interferometers and/or encoder measurement systems. The relative position of the imprint template and the substrate can for example be determined from a position measurement of the template holder relative to the support structure and a position measurement of the substrate holder relative to the support structure (schematically indicated by the arrows 142 and 144). In order to obtain an accurate alignment, the positioning of the imprint template relative to the substrate should be performed substantially without the influence of external disturbances such as floor vibrations or the like. Therefore, the apparatus according to an embodiment of the invention comprises a vibration isolation system 150 arranged on a base 160 of the apparatus and arranged to provide a vibration isolation of a support structure that supports the imprint template holder and/or the substrate holder. Such a vibration isolation system can for example comprise one or more so-called airmounts which can be characterized as low-stiffness supports, for example having a cut-off frequency or eigenfrequency of 1 Hz or less. Such a vibration isolation system can thus operate as a filter mitigating the transfer of vibrations such as floor vibrations to the support structure supporting the imprint template holder or substrate holder. Mitigating the transfer of such vibrations facilitates an accurate alignment of the imprint template and substrate.

Once the alignment is obtained, the imprint template can be brought in contact with an imprintable medium provided on the substrate and subsequently pushed into the imprintable medium. Such a displacement can for example be obtained by an appropriate displacement of the imprint template holder relative to the substrate holder, by the actuator mechanism. In order to push the imprint template into the imprintable medium (which can for example be a resin or a UV curable liquid), the imprint template can be displaced (e.g. by an actuator of the actuator mechanism) towards the substrate. As a result, a relatively large force (e.g. approx. 100 N) can be exerted on the substrate and thus the substrate holder. In case the substrate holder is supported by the support structure, the force exerted on the substrate can affect the position of the support structure, due to the mounting of the support structure on the vibration isolation system. Equally, as indicated in FIG. 2, in case the imprint template holder 110 is mounted to the support structure 140, exerting a force 170 (by the imprint template) on the substrate would result in an equal and opposite reactive force 180 on the support structure which could result in a displacement of the support structure. In general, when using a vibration isolation system that has a comparatively low stiffness, the force exerted on the support structure, either via the imprint template holder or the substrate holder, can result in a significant displacement of the support structure 140. Such a displacement of the support structure should in general not be harmful to the apparatus or the substrate, but it may affect the throughput of the apparatus. This can be understood as follows:

After the imprint template is pushed into the imprintable medium, the imprintable medium is hardened, e.g. by cooling down or by UV curing and the imprint template can be moved away from the substrate. As a result, the aforementioned force is no longer exerted on the support structure and the support structure would return to a nominal position. Note that, in order to release the imprint template from the substrate, a release force (exerted in a direction substantially opposite to the direction of the aforementioned force) may be required due to the hardening of the imprintable medium. Due to the dynamical characteristics of the vibration isolation system (e.g. a comparatively low stiffness, in order to obtain a low eigenfrequency and/or a comparatively low damping), it may take a long time before the support structure has reached its nominal position again. Depending on the characteristics of the vibration isolation system, this could take several seconds or even minutes. During this idle time, the apparatus cannot proceed with a subsequent imprint process applying the imprint template at a different location on the substrate.

In order to reduce this idle time, the following measure is applied in the apparatus according to an embodiment of the invention: The vibration isolation system of the apparatus is provided with an adjustable member that enables an adjustment of a dynamical characteristic of the vibration isolation system during at least part of the imprint process.

In an embodiment, the adjustable member can comprise an actuator that can be controlled to exert a force between the base and the support structure thereby effectively compensating the applied force on the support structure. The application of such an actuator which is controlled by a control unit of the apparatus can counteract, or at least partly compensate, a displacement of the support structure (e.g. due to the application of an imprint force on the substrate).

In an embodiment, the adjustable member can comprise an adjustable damper, e.g. a magneto-rheological damper. By increasing the damping as provided by such a damper, the displacement of the support structure (e.g. due to the application of an imprint force on the substrate) can be mitigated.

In particular, during the stamping process, i.e. the part of the imprint process whereby the imprint template is pushed into the imprintable medium, the damping with respect to the base can be increased, up to a level that a substantially fixed coupling to the base is obtained. By doing so, the position of the support structure can substantially be maintained. More details on such a magneto-rheological damper are provided below.

As a result, the application of a vibration isolation system comprising an adjustable member as mentioned, can reduce a displacement of the support structure relative to the base due to a force exerted on the support structure during the imprint process. By doing so, the idle time, i.e. the time expiring between two consecutive imprints on a substrate, can be reduced.

The control of the adjustable member of the vibration isolation system by the control unit 190 of the apparatus (said control unit can for example be implemented as for example a microprocessor or microcomputer) can for example be based on the force as applied by the imprint template during the imprint process. As such, a control signal for controlling the adjustable member (e.g. controlling a current as applied in an actuator of the adjustable member or as applied in a coil of a magneto-rheological damper of the adjustable member) can be derived from a control signal controlling the actuator mechanism of the apparatus.

As an example, the control signal controlling the adjustable member can be proportional to the force exerted by the imprint template to the substrate. Alternatively, the control signal can enable a specific, for example predetermined, change in the dynamical characteristic (e.g. the stiffness and/or damping characteristic) of the vibration isolation system when the force as applied by the actuator mechanism exceeds a certain threshold. Such a threshold can for example be based on the required force to push the imprint template into the imprintable medium. As such, the adjustment of the dynamical characteristic of the vibration isolation system is only applied when the imprint template and the substrate are in contact, via the imprintable medium. Note that when the imprint template and the substrate are in contact, the vibration isolation specifications on the isolator become less strict, as the relative position between imprint template and substrate is at least partially defined by the contact itself. Therefore, an increased stiffness and/or damping of the vibration isolation system is allowed in this phase of the process.

Figure 3:
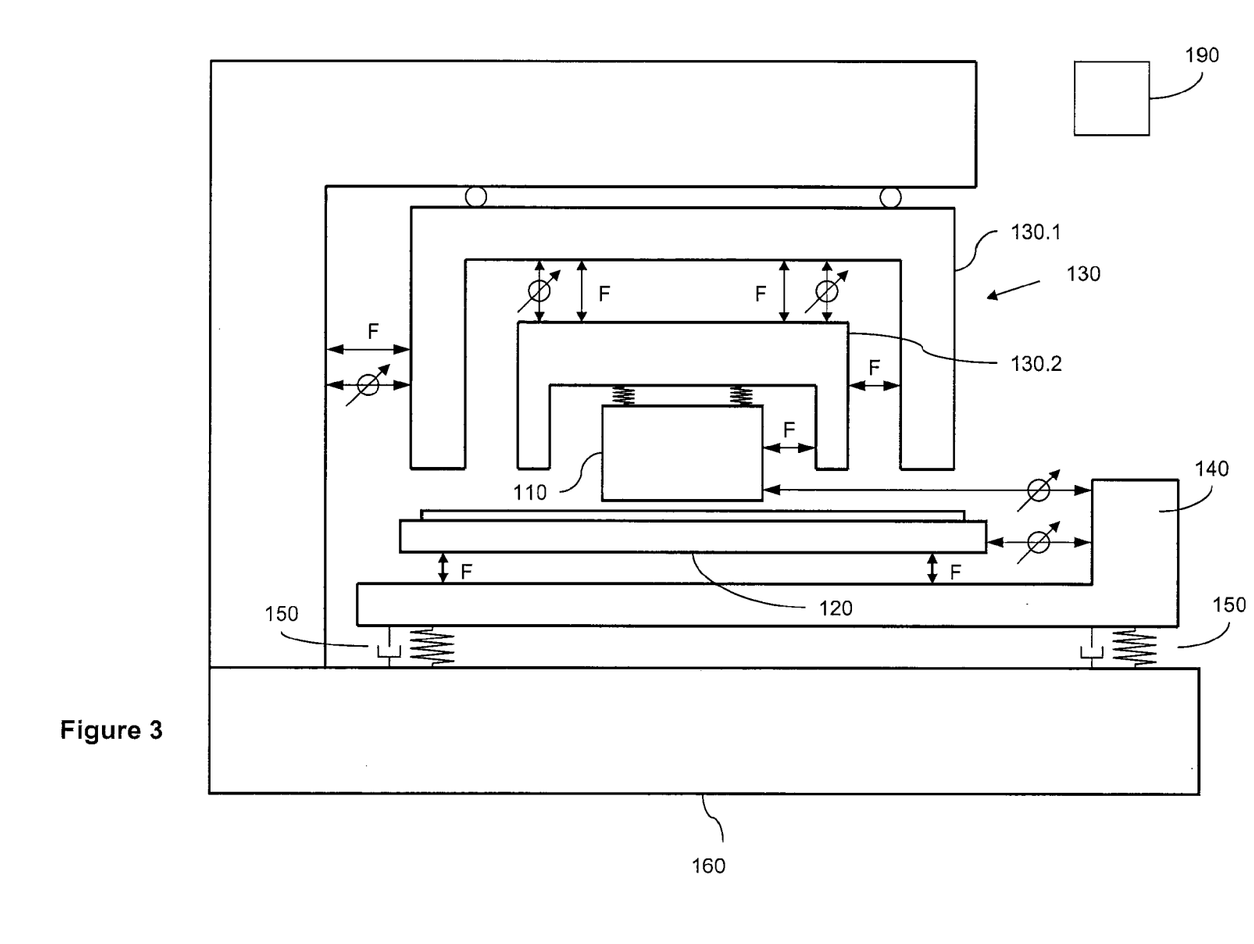
FIG. 3 schematically depicts an embodiment of a vibration isolation system as can be applied in an imprint lithographic apparatus according to an embodiment of the invention.

In FIG. 3, an embodiment of an imprint lithography apparatus according to the invention is schematically depicted wherein the same reference numbers are used to denote the same elements. In FIG. 3, the support structure 140, Which is isolated from the base 160 by the vibration isolation system 150 is used to support a substrate holder 120, e.g. a substrate table. In the illustrated embodiment, the actuator mechanism 130 comprises a so-called long-stroke actuator 130.1 for displacing the imprint template holder 110 over comparatively large distances and a short-stroke actuator 130.2 for displacing the imprint template holder 110 over comparatively short distances. In the embodiment as shown, a force exerted by the imprint template (held by the imprint template holder) could result in a relatively large displacement of the support structure 140 supporting the substrate holder. Once such force is removed, the support structure could start to oscillate about its nominal position, whereby such oscillation could continue for seconds or even minutes before the support structure is stabilized in its nominal position. The introduction of an adjustable member that enables a dynamical characteristic of the vibration isolation system to be altered can mitigate or even substantially avoid such oscillation.

Figure 4:
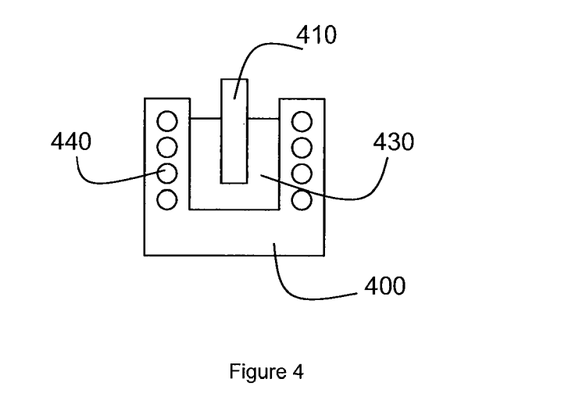
FIG. 4 schematically depicts a an embodiment of a magneto-rheological damper as can be applied in an apparatus according to an embodiment of the invention.

In FIG. 4, a magneto-rheological damper that can be applied as an adjustable member of a vibration isolation system is schematically depicted. The damper comprises a first part 400, which can for example be mounted to a base, and a second part 410 which can be mounted to a support structure. The damper further comprises a magneto-rheological fluid 430 which is provided between the first and second part. The damper further comprises a coil 440 arranged to, when a current is provided to the coil, generate a magnetic field in the magneto-rheological fluid. Due to the magnetic field, the viscosity of the fluid changes. As such, the current through the coil determines the viscosity of the magneto-rheological fluid. At zero current, the magneto-rheological fluid behaves like a low-viscosity fluid. At high currents, it behaves like a visco-elastic material. In between zero current and high currents, the damping is dependent on the magnetic field. The magneto-rheological damper as depicted, can for example be integrated in a vibration isolation system as depicted in FIG. 5.

Figure 5:
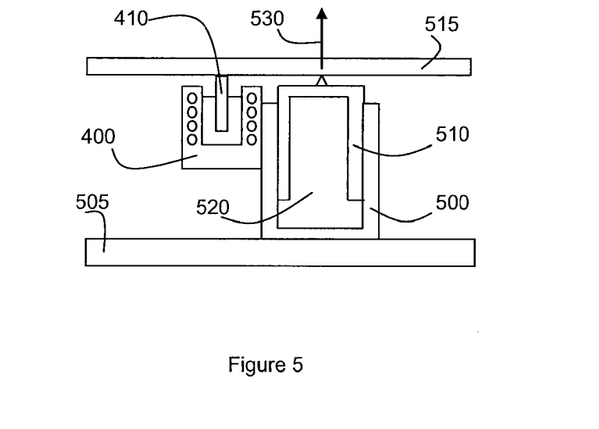
FIG. 5 schematically depicts an embodiment of a vibration isolation system comprising a magneto-rheological damper as can be applied in an apparatus according to an embodiment of the invention.

In FIG. 5, a vibration isolation system comprising a low stiffness support, in particular an airmount, is schematically depicted. The airmount as depicted comprises a first part 500 which can for example have a substantially cylindrical shape and which is for example mounted to a base 505, and a second part 510 mounted inside the first part, which can be used to support a support structure 515. A pressurized gas (e.g. air) is provided inside the volume 520 defined by the first and second part and enables a supporting force 530 to be exerted on the supporting structure. Such a construction can provide a support that is characterized by a comparatively low stiffness and thus operates as filter for vibrations occurring in the base 505. As further shown in FIG. 5, a magneto-rheological damper as shown in FIG. 4 is provided whereby the first part 400 of the damper is connected to the first part 500 of the airmount and whereby the second part 410 of the damper is mounted to the support structure 515. When such a vibration isolation system is applied in an imprint lithography apparatus according to the invention, the damping of the isolation system can for example be adjusted (for example increased) during part of the imprint process. By applying a comparatively large current to the coil of the magneto-rheological damper after the alignment phase, the support structure can be made rigidly coupled to the floor. As such, a displacement of the support structure due to forces exerted on the structure during the imprint process, can substantially be prevented. Note that the adjustable damper, e.g. the magneto-rheological damper, need not be integrated with a low-stiffness support as shown in FIG. 5. Such a damper (or dampers) can also be applied on other, different locations between the base and support structure.

It can further be noted that a magneto-rheological damper as schematically depicted in FIGS. 4 and 5 can have a fast response time. Within milliseconds, the viscosity (and thus the damping) of the magneto-rheological fluid can be adjusted. As such, when the imprint template is released from the substrate (after hardening of the imprintable medium), the viscosity can be reduced rapidly and a new imprint cycle can be started. As such, the idle time between consecutive imprint cycles can be reduced.

Figure 6:
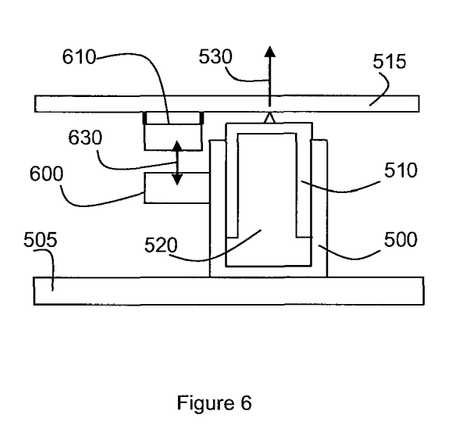
FIG. 6 schematically depicts an embodiment of a vibration isolation system comprising an actuator as can be applied in an apparatus according to an embodiment of the invention.

As an alternative to the application of an adjustable damper, an actuator can be applied whereby the actuator is arranged to exert a force between the base and support structure such that a displacement of the support structure can, at least partly, be opposed. Such an arrangement is schematically depicted in FIG. 6. The arrangement as shown comprises a low-stiffness support as illustrated in FIG. 5, combined with an actuator comprising a first part 600 connected to the first part 500 of the airmount and a second part 610 that is mounted to the support structure 515. The actuator can exert a force 630 on the support structure, e.g. in support of the supporting force 530 of the airmount. By doing so, the effect of an imprint force on the support structure, i.e. a displacement of the support structure, can be mitigated or substantially avoided. The force as provided by the actuator can be controlled by the control unit 190 (see for example FIG. 2 or 3) of the imprint lithography apparatus comprising the vibration isolation system. As an example, during the imprint and/or release phase of the imprint process, the operation of the vibration isolation system can for example be adjusted such that the system temporarily operates at an increased eigenfrequency, e.g. 10 Hz instead of 1 or 0.5 Hz, by applying a force that is proportional to the displacement of the support structure with respect to the base. As such, the stiffness does not change by selecting a counteracting force equal to the imprint force. In that case, the force balance substantially ensures absence of displacement while the stiffness remains low. Generalizing this, the actuator as for example shown in FIG. 6 can provide an adjustable force to the support structure during at least part of the imprint process to reduce a displacement of the support structure relative to the base during the imprint process. When such a force is applied, the vibration isolation system temporarily has a modified characteristic, e.g. a different eigenfrequency or a different support force.

It is worth noting that the application of the adjustable member to modify a dynamical characteristic of the vibration isolation system during at least part of the imprint process can mitigate or substantially avoid both translational displacements and rotational displacements of the support structure. Avoiding rotational displacements is in particular desirable because a rotation of the support structure when the imprintable medium has been hardened could result in damage to the imprinted pattern.

Embodiments of the present invention relate to imprint lithography apparatus and methods. The apparatus and/or methods may be used for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc.

In this specification, the term "substrate" is meant to include any surface layers forming part of the substrate, or being provided on another substrate, such as planarisation layers or anti-reflection coating layers.

In the above embodiments, a single imprint template, a single imprint template holder, a single substrate holder and a single substrate are shown to be provided in a single chamber of the apparatus. In other embodiments, more than one imprint template, more than one imprint template holder, more than one substrate holder, and/or more than substrate may be provided in one or more chambers, in order for imprints to be undertaken more efficiently or quickly (e.g. in parallel). For example, in an embodiment, there is provided an apparatus that includes a plurality (e.g. 2, 3, or 4) of substrate holders. In an embodiment, there is provided an apparatus that includes a plurality (e.g. 2, 3, or 4) of imprint template arrangements. In an embodiment, there is provided an apparatus configured to use one template holder arrangement per substrate holder. In an embodiment, there is provided an apparatus configured to use more than one imprint template holder arrangement per substrate holder. Where this is the case, an alignment apparatus may be provided for each imprint template holder. In an embodiment, there is provided an apparatus that includes a plurality (e.g. 2, 3, or 4) of imprintable medium dispensers. In an embodiment, there is provided an apparatus configured to use one imprintable medium dispenser per substrate holder. In an embodiment, there is provided an apparatus configured to use one imprintable medium dispenser per imprint template arrangement. In an embodiment, where an apparatus is provided that includes a plurality of substrate holders, the substrate holders may share functionalities in the apparatus. For instance, the substrate holders may share a substrate handler, a substrate cassette, a gas supply system (e.g. to create a helium environment during imprinting), an imprintable medium dispenser, and/or a radiation source (for curing the imprintable medium). In an embodiment, two or more of the substrate holders (e.g. 3 or 4) share one or more functionalities of the apparatus (e.g. 1, 2, 3, 4, or 5 functionalities). In an embodiment, one or more functionalities (e.g. 1, 2, 3, 4, or 5) of the apparatus are shared among all substrate holders.

The described and illustrated embodiments are to be considered as illustrative and not restrictive in character, it being understood that only the preferred embodiments have been shown and described and that all changes and modifications that come within the scope of the inventions as defined in the claims are desired to be protected. It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the invention as defined in the appended claims. In relation to the claims, it is intended that when words such as "a," "an," "at least one," or "at least one portion" are used to preface a feature there is no intention to limit the claim to only one such feature unless specifically stated to the contrary in the claim. When the language "at least a portion" and/or "a portion" is used the item can include a portion and/or the entire item unless specifically stated to the contrary.

What is claimed is:

1. An imprint lithography apparatus comprising:
   an imprint template holder configured to hold an imprint template;
   a substrate holder configured to hold a substrate;
   an actuator configured to displace the imprint template holder towards the substrate holder to perform an imprint process;
   a support structure configured to support the substrate holder;
   a base that supports the imprint template holder and the substrate holder;
   wherein the support structure is mounted to a vibration isolation system that is mounted to and supported by the base so that the vibration isolation system is arranged between the support structure and the base, the vibration isolation system configured to provide a vibration isolation of the support structure relative to the base, and wherein the imprint template holder is supported by the base without using the vibration isolation system;
   a control unit configured to control the actuator during the imprint process, the control unit being arranged to control an adjustable member of the vibration isolation system to adjust a dynamical characteristic of the vibration isolation system during at least part of the imprint process so as to reduce a displacement of the support structure relative to the base due to a force exerted on the support structure during the imprint process,
   wherein the vibration isolation system comprises an airmount configured to support the support structure, the airmount comprising a first airmount part mounted to the base and a second airmount part mounted to the support structure, the airmount configured to exert a supporting force on the support structure, and wherein the adjustable member comprises a second actuator that includes a first actuator part mounted to the first airmount part and a second actuator part that is mounted to the support structure, the second actuator configured to exert an actuator force on the support structure, the actuator force being provided along a same direction as the supporting force, the control unit being arranged to control the actuator force of the second actuator to reduce the displacement of the support structure.

2. The imprint lithography apparatus according to claim 1, wherein the dynamical characteristic comprises a stiffness, the control unit being arranged to control the adjustable member to increase the stiffness of the vibration isolation system during at least part of the imprint process.

3. The imprint lithography apparatus according to claim 1, wherein the dynamical characteristic comprises a damping, the control unit being arranged to control the adjustable member to increase the damping of the vibration isolation system during at least part of the imprint process.

4. The imprint lithography apparatus according to claim 1, wherein said imprint template holder is supported by a frame that is in contact with the base.

5. The imprint lithography apparatus according to claim 1, wherein the control unit is arranged to control the adjustable member of the vibration isolation system using a control signal that is derived from a signal controlling the actuator during the imprint process.

6. The imprint lithography apparatus according to claim 1, wherein said imprint template holder is supported by the base without using the support structure when at least said imprint template is out of contact with the substrate.

7. The imprint lithography apparatus according to claim 1, wherein the control unit is configured to control the actuator force of the second actuator such that during the imprint process the actuator force is proportional to the displacement of the support structure with respect to the base.

8. An imprint lithography apparatus comprising:
- an imprint template holder configured to hold an imprint template;
- a substrate holder configured to hold a substrate;
- an actuator configured to displace the imprint template holder towards the substrate holder to perform an imprint process;
- a support structure configured to support the substrate holder;
- a base configured to support the imprint template holder and the substrate holder;
- wherein the support structure is mounted to a vibration isolation system that is mounted to and supported by the base so that the vibration isolation system is arranged between the support structure and the base, the vibration isolation system configured to provide a vibration isolation of the support structure relative to the base, said imprint template holder being supported by the base without using the vibration isolation system, and
- a control unit configured to control the actuator during the imprint process, the control unit being arranged to control an adjustable member of the vibration isolation system using a control signal that is derived from a signal controlling the actuator to adjust a dynamical characteristic of the vibration isolation system during at least part of the imprint process so as to reduce a displacement of the support structure relative to the base due to a force exerted on the support structure during the imprint process,
- wherein the vibration isolation system comprises an airmount configured to support the support structure, the airmount comprising a first airmount part mounted to the base and a second airmount part mounted to the support structure, the airmount configured to exert a supporting force on the support structure, and wherein the adjustable member comprises a second actuator that includes a first actuator part mounted to the first airmount part and a second actuator part that is mounted to the support structure, the second actuator configured to exert an actuator force on the support structure, the actuator force being provided along a same direction as the supporting force, the control unit being arranged to control the actuator force of the second actuator to reduce the displacement of the support structure.

9. The imprint lithography apparatus according to claim 8, wherein the dynamical characteristic comprises a stiffness, the control unit being arranged to control the adjustable member to increase the stiffness of the vibration isolation system during at least part of the imprint process.

10. The imprint lithography apparatus according to claim 8, wherein the dynamical characteristic comprises a damping, the control unit being arranged to control the adjustable member to increase the damping of the vibration isolation system during at least part of the imprint process.

11. The imprint lithography apparatus according to claim 8, wherein the control unit is configured to control the actuator force of the second actuator such that during the imprint process the actuator force is proportional to the displacement of the support structure with respect to the base.

* * * * *